US006107649A

United States Patent [19]
Zhao

[11] Patent Number: 6,107,649
[45] Date of Patent: Aug. 22, 2000

[54] FIELD-CONTROLLED HIGH-POWER SEMICONDUCTOR DEVICES

[75] Inventor: Jian H. Zhao, North Brunswick, N.J.

[73] Assignee: Rutgers, The State University, New Brunswick, N.J.

[21] Appl. No.: 09/095,481

[22] Filed: Jun. 10, 1998

[51] Int. Cl.$^7$ .......................... H01L 29/745; H01L 29/78
[52] U.S. Cl. .......................... 257/138; 257/139; 257/147; 257/110; 257/133; 257/134
[58] Field of Search .................................. 257/133, 134, 257/138, 139, 147, 110

[56] References Cited

U.S. PATENT DOCUMENTS

| | | | |
|---|---|---|---|
| 4,827,321 | 5/1989 | Baliga | 357/37 |
| 4,912,541 | 3/1990 | Baliga et al. | 357/38 |
| 4,959,703 | 9/1990 | Ogura et al. | 357/38 |
| 5,005,065 | 4/1991 | Piccone et al. | 357/38 |
| 5,021,855 | 6/1991 | Oikawa et al. | 357/38 |
| 5,153,695 | 10/1992 | Gobrecht et al. | 357/38 |
| 5,338,945 | 8/1994 | Baliga | 257/77 |
| 5,412,228 | 5/1995 | Baliga | 257/133 |
| 5,448,081 | 9/1995 | Malhi | 257/77 |
| 5,451,797 | 9/1995 | Davis et al. | 257/77 |
| 5,461,242 | 10/1995 | Muraoka et al. | 257/136 |
| 5,486,484 | 1/1996 | Malhi | 437/41 |
| 5,510,281 | 4/1996 | Ghezzo et al. | 437/41 |
| 5,539,217 | 7/1996 | Edmond et al. | 257/77 |
| 5,543,637 | 8/1996 | Baliga | 257/77 |
| 5,569,949 | 10/1996 | Malhi | 257/397 |
| 5,614,737 | 3/1997 | Piccone | 257/124 |
| 5,625,203 | 4/1997 | Lilja | 257/138 |
| 5,665,987 | 9/1997 | Muraoka et al. | 257/133 |
| 5,681,762 | 10/1997 | Baliga | 437/22 |
| 5,682,044 | 10/1997 | Tamamushi et al. | 257/147 |
| 5,686,755 | 11/1997 | Malhi | 257/492 |
| 5,723,891 | 3/1998 | Malhi | 257/341 |

OTHER PUBLICATIONS

*High–Voltage Double–Implanted Power MOSFET's in 6H–SiC*, Jayarama N. Shenoy, James A. Cooper, Jr. and Michael R. Melloch, IEEE Electronic Device Letters, vol. 18. No. 3 Mar. 1997.

*Critical Materials, Device Design, Performance and Reliability Issues in 4H–SIC Power Umosfet Structures*, A.K. Agarwal, et al., 1996 Materials Research Society, Mat. Res. Soc. Symp. Proc., vol. 423, p. 87–92.

*SiC Power Device Development*, A.K. Agarwal, et al., All Electric Combat Vehicle—Second International Conference Jun. 8th–12th 1997—Dearborn, Michigan, p. 13–19.

*Recent Advances in SiC Power Devices*, James A. Cooper, Jr., School of Electrical and Computer Engineering, Purdue University.

*1100 V 4H–SiC Power MOSFETs*, A.K. Agarwal et al., Apr. 11, 1997, Submitted to International Conference on Silicon Carbide, III–nitrides and Related Materials—1997, Aug. 31–Sep. 5, 1997, Sweden.

*700–V Asymmetrical 4H–SiC Gate Turn–Off Thyristors (GTO's)*, A.K. Agarwal et al., IEEE Electron Device Letters, vol. 18, No. 11, Nov. 1997, p. 518–520.

*Primary Examiner*—Jerome Jackson, Jr.
*Attorney, Agent, or Firm*—Lerner, David, Littenberg, Krumholz & Mentlik, LLP

[57] ABSTRACT

Power semiconductor devices have a plurality of semiconductor layers of alternating p-type and n-type conductivity and top and bottom device surfaces. A layer of the top surface forms a control layer. A semiconductor layer junction, remote from top and bottom device surfaces, forms a blocking p-n junction capable of sustaining the applied device voltage. A top ohmic contact overlays a top conductive region extending from the top surface into the control layer. A conductive tub region, spaced apart from the top conductive region, extends from the top surface at least through the control layer. A field effect region is disposed in the control layer between the top conductive region and tub region. A gate contact is formed over the field effect region causing the creation and interruption of a conductive channel between the top conductive region and the conductive tub region so as to turn the device on and off. In one device embodiment, a separate latch-on gate overlying the conductive tub is provided for device turn-on.

41 Claims, 14 Drawing Sheets

FIELD-CONTROLLED HIGH-POWER SEMICONDUCTOR DEVICES

FIELD OF THE INVENTION

This invention relates to power semiconductor devices, and more particularly relates to power semiconductor devices in which a p-n junction, remote from the device surfaces, carries the device operating voltage and field effect gates are used to control the device operation.

BACKGROUND OF THE INVENTION

Power semiconductors, as distinguished from signal semiconductors, are used to process and control the flow of electric energy supplied to user loads. The utility of such devices is driven by their ability to quickly and efficiently switch on and off large operating voltages and currents. Power semiconductor switching devices are increasingly being designed to handle applications requiring high blocking voltages in the off condition, typically 1 kV and greater, and high current requirements in the on state, typically 1A and greater. Recent advances in device operating thresholds, however, have imposed operational and fabrication-related problems for power semiconductor devices.

Historically, power semiconductor devices have required large switching currents to handle the corresponding high device currents. Large switching currents result in device inefficiencies since excessive electrical power is required to operate the device. Power semiconductor devices to-date have employed metal-oxide-semiconductor (MOS) gate structures in a variety of arrangements to achieve the low current turn-on and turn-off requirements of these devices. However, MOS gates have experienced operational and fabrication-related reliability problems as the operational boundaries of the power semiconductor devices have been expanded. In particular, the high operating device voltages create large electric fields within these devices, which poses long-term reliability problems for the oxides used in the MOS gates. Trenched MOS gates (UMOS), as found in the paper by A. K. Agarwal et al. entitled SiC Power Device Development given at the All Electric Combat Vehicle (AECV) Second International Conference 8th–12th June 1997, and buried structures, U.S. Pat. No. 5,543,637, have been employed to partially overcome these oxide limitations. In each of these arrangements, however, large electric fields are still present at the oxide interfaces thereby compromising the long-term oxide reliability. Finally, gate oxides are often fabricated on implanted semiconductor regions, which results in low oxide quality and reliability, particularly in power devices fabricated from SiC. An exemplary high-power thyristor device employing such a MOS gate structure can be found in the above article by A. K. Agarwal.

The need exists for monolithic, simply constructed, easily fabricated, power semiconductor devices in which the controlling gate structures are removed from the large electric fields within the device. Although non-oxide gate structures are preferred, the need also exists to provide a reliable, non-implanted semiconductor surface on which to fabricate gate oxides, for those power semiconductors which continue to employ MOS gates, and to isolate such gate oxide from the large electric field stresses.

SUMMARY OF THE INVENTION

One aspect of the present invention provides a monolithic, power semiconductor device including a semiconductor structure with top and bottom surfaces and multiple layers of semiconductor material of alternating n-type and p-type conductivity therebetween. Ohmic device contacts are included on the semiconductor top and bottom surfaces. The relative doping and thicknesses of the semiconductor layers are chosen so as to create a high-voltage blocking p-n junction, not accessible at the semiconductor surfaces. A top layer which functions as a control layer is also formed. A top conductive region, connected to the top device contact, and a vertically-extensive conductive region extending through the control layer, referred to herein as a "tub", are provided. These regions may be formed by ion implantation. The top conductive region and the tub are spaced apart from one another. A gate structure including a gate contact is constructed on the control layer so as to control the flow of current between the top conductive region and the tub. In particular, a gate potential controls an electric field within the control layer under the gate structure, which creates or interrupts a low resistance conductive channel in the control layer between the top conductive region and the tub. The conductive channel permits current to flow from the top conductive region across the control layer, through the tub and downward towards the blocking p-n junction. Depending on the type of the semiconductor device, this current flow will cause the device to be turned either "on" or "off".

As explained in greater detail below, the high voltage applied between the device terminals is blocked primarily by the blocking p-n junction, which lies remote from the top and bottom surfaces of the device. The high voltage does not appear as high potential gradients on the top surface of the device. Therefore, the gate contact and associated elements on the top surface of the device are not subjected to high stress during operation.

Other aspects of the present invention provide various gate structures to effect the creation and interruption of the conductive channel. More particularly, the gate contact can include a metal contact overlying the control layer, thereby forming a Schottky barrier-controlled, field effect region in the control layer (MESFET). Alternatively, a shallow ion implanted or epitaxially grown region, of different conductivity type than the control channel, can be formed under a metal gate contact, thereby forming a junction field effect region in the control layer (JFET). These structures do not require insulative layers such as oxides beneath the gate contact, and thus obviate the difficulties which have been encountered with such layers in prior power semiconductor devices. In other embodiments, metal-oxide-semiconductor gate structures are employed. In these preferred MOS structures according to the invention, the field effect region includes an epitaxially deposited, unimplanted region of the control layer. The metal oxide structures can reliably be fabricated on this epitaxially deposited, unimplanted region of the control layer to form either enhancement or depletion mode MOSFETS. Thus, even where MOS structures are employed, the difficulties associated with growing the oxide or other insulating region over an ion-implanted region are obviated.

Different power semiconductor devices are also capable of being constructed in accordance with the present invention. In a preferred embodiment of one device, a four layer p-n-p-n or n-p-n-p field turn-off thyristor (FTO) is constructed resulting in an upper p-n junction, a blocking p-n junction, and a lower p-n junction, in top-to-bottom order, within the device. These p-n junctions are separated from one another and from the semiconductor device surfaces. The top conductive region of the thyristor desirably includes a double implanted structure. A first implanted subregion of the top conductive region, having a different conductivity type than the control layer, extends into the control layer to a first depth. A second implanted subregion, of same conductivity type as the control layer, is implanted between the first subregion and the field effect region, and extends into the control layer to a second depth. The top device contact provides electrical contact with both subregions. A conductive tub, which extends through the control layer and the upper p-n junction is overlaid with a latch-on gate. A controlled current source applied to the latch-on gate is used to inject current into the thyristor tub, in the absence of a control layer conductive channel, thereby turning the thyristor "on". The thyristor is then turned off, in the absence of a control current source at the latch-on gate, by creating a control layer conductive channel to shunt some of the device current from the first implanted subregion through the tub towards the blocking p-n junction.

Other aspects of the present invention include alternative power semiconductor devices, such as field-controlled transistors and field gated bipolar transistors. The differences between these devices and the thyristor include the number of p-n junctions needed to create the device and the need for only one gate structure to both turn-on and turn-off the devices. These devices provide the same structural and operational advantages discussed above.

DETAILED DESCRIPTION OF THE PREFERRED EMBODIMENTS

Figure 1A:
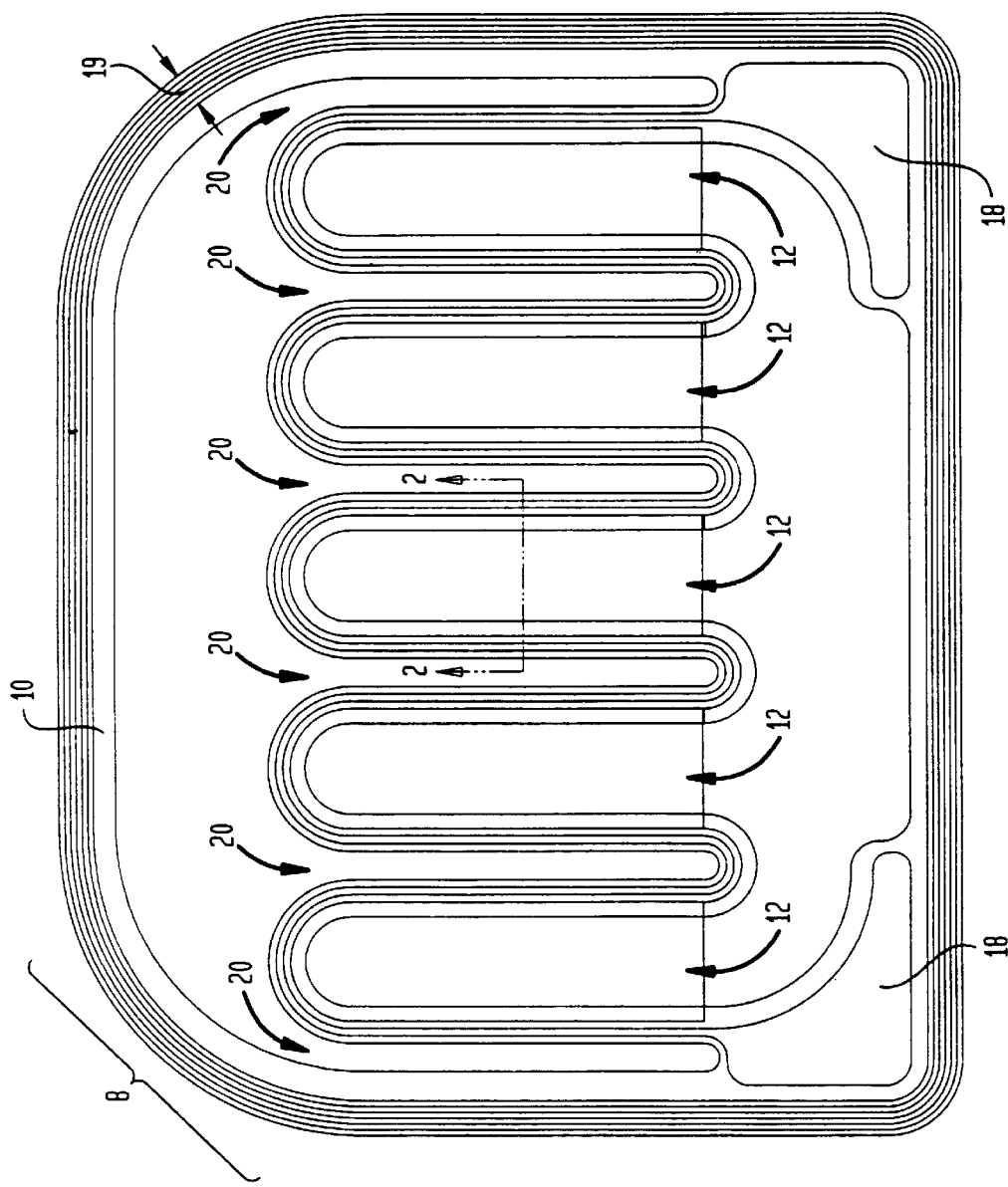
FIG. 1A is a plan view of the multilayer wafer of a full power semiconductor device embodying one form of the invention.
Figure 1B:
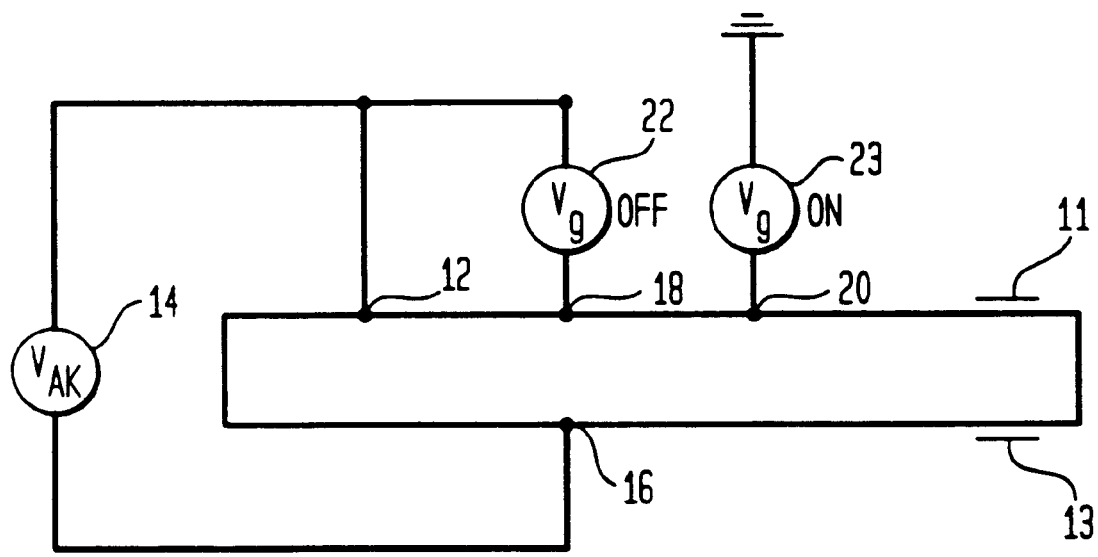
FIG. 1B is a side view of the wafer of FIG. 1A with applied control sources attached.

Referring to FIGS. 1A and 1B, in accordance with one embodiment of the invention a power semiconductor device 8 consists of a thin semiconductor wafer 10 comprised of multiple semiconductor layers extending through the wafer. Wafer 10 is bounded by top device surface 11 and bottom device surface 13. The device includes top ohmic contact 12 and bottom ohmic contact 16 for connection to external applied device voltage 14. Interdigitated gate contact 18, top ohmic contact 12 and thyristor turn-on gate contact 20 are formed on the top surface 11. External applied gate voltage is shown at 22 and external biasing current source at 23. Alternative geometries and layouts for the device contacts 12, 18 and 20 are also feasible. Wafer 10 is preferably made of SiC, although alternative semiconductor materials capable of both p-type and n-type doping, including SiC, Si, Diamond, GaAs, GaN, AlN, AlGaN, InGaN, GaP, AlGaP or AlGaAsP, may be used. Peripheral edge termination rings 19, or other edge termination structures, may also be used.

Figure 2A:
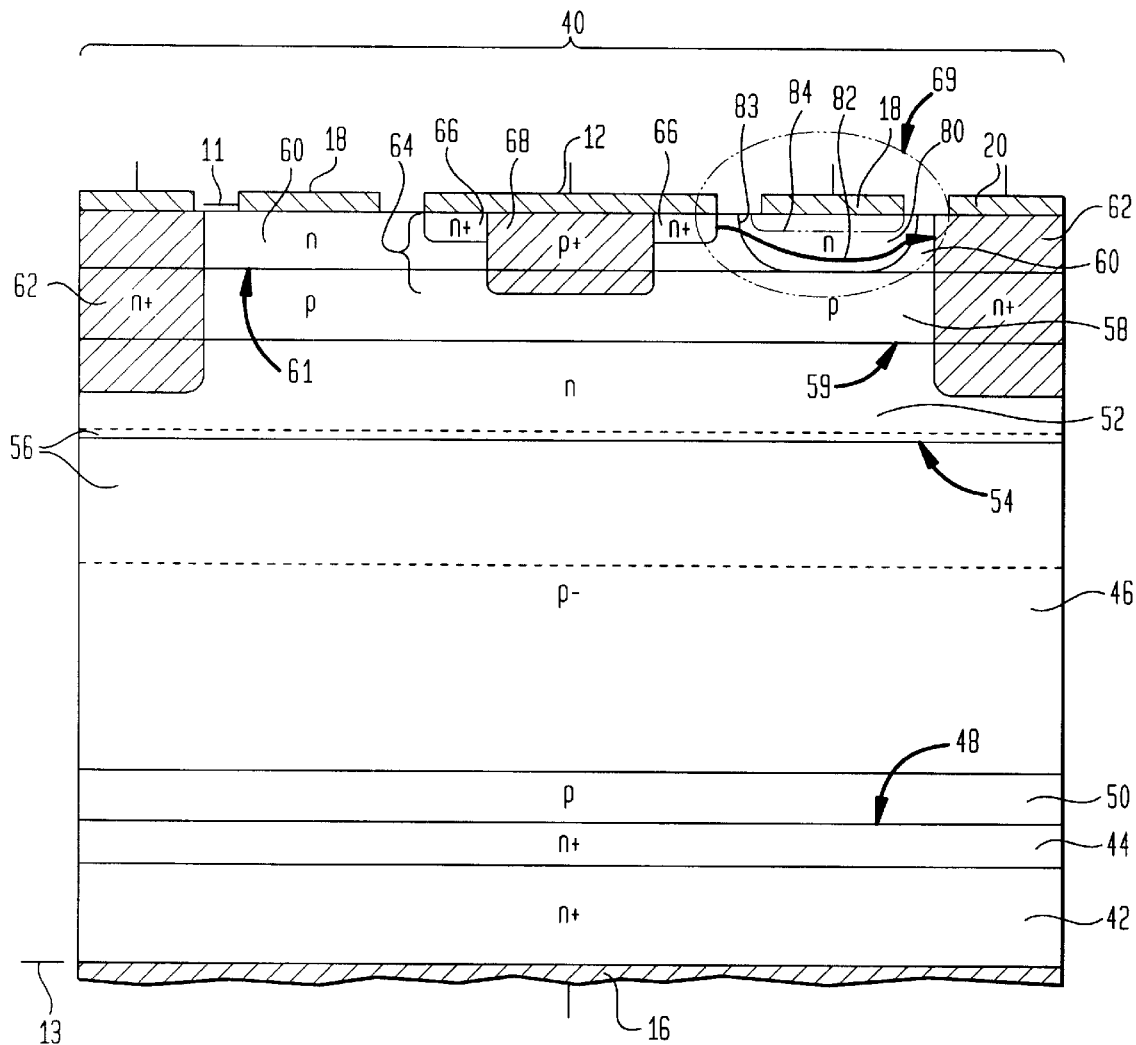
FIG. 2A is an enlarged sectional view of a single field turnoff thyristor cell along line 2—2 of FIG. 1.

FIG. 2A represents a single section or "cell" 40 of wafer 10 as seen through section 2—2 of FIG. 1A. In particular, cell 40 of FIG. 2 is a power thyristor made of SiC according to one preferred embodiment of the invention. It should be appreciated that wafer 10 includes numerous cells 40 of the type described. The semiconductor structure of FIG. 2A includes a bottom layer n+ substrate 42. The doping concentration of substrate 42 is typically $1 \times 10^{19}/cm^3$ or greater. Substrate 42 is also in contact with bottom ohmic contact 16 (thyristor cathode) at bottom device surface 13. An optional, relatively thin n+ buffer layer 44, of 0.5 μm for example, may be epitaxially grown on the upper surface of substrate 42 to improve the quality of subsequently grown semiconductor layers. Buffer layer 44 is typically used as a bed upon which subsequent semiconductor layers of high crystalline quality are epitaxially grown when substrate 42 is cut from a bulk source. Buffer layer 44 has a doping concentration similar to that of substrate 42.

P– blocking layer 46 is epitaxially grown on buffer layer 44 to form lower p-n junction 48. Blocking layer 46 is relatively thick and lightly doped as compared to substrate 42. Blocking layer 46 optionally includes p doped intermediate layer 50 adjacent to either substrate 42 or optional buffer layer 44. Intermediate layer 50 is epitaxially grown prior to blocking layer 46 and is more heavily doped than blocking layer 46. Intermediate layer 50 is typically included to create an asymmetric device having a more uniformly distributed electric field in blocking layer 46 under forward-biased applied device voltage 14. An n-type conduction layer 52 is epitaxially grown on blocking layer 46 to form blocking p-n junction 54. Conduction layer 52 is thinner and has a greater doping concentration than blocking layer 46. Depletion regions 56 are formed in conduction layer 52 and blocking layer 46. The higher doping concentration of conduction layer 52 vis-a-vis blocking layer 46 results in a larger depletion region 56 within blocking layer 46 than in conduction layer 52.

P anode layer 58 is epitaxially grown on conduction layer 52 forming upper p-n junction 59. Anode layer 58 should have a thickness and doping level such that its intralayer conductivity, i.e. parallel to top and bottom surfaces 11 and 13 and parallel to upper p-n junction 59, is much lower than that of conduction layer 52. N-type control layer 60 is epitaxially grown on anode layer 58 forming control p-n junction 61. It should be appreciated that the doping concentration and thickness of control layer 60 are variable in determining both the maximum range of externally applied gate voltage 22 used to switch semiconductor device 8 off and the maximum current to be controlled through top contact 12. Other semiconductor growth methods may also be used to form any one or more of semiconductor layers described above.

N+ conductive tub region 62, and top conductive region 64, are created by ion implantation into control layer 60. More particularly, these regions are preferably created by triple ion implantation consisting of a first implantation to create n+ tub 62 a second implementation to create n+ first subregion 66, and a third implantation to create p+ second subregion 68. Alternatively, first subregion 66 and tub region 62 can be created during a single ion implantation step by using a sacrificial mask layer on top of first subregion 66. The n+ implantation can be performed using any n-type dopant although nitrogen is preferred. The p+ implantation can be performed using any p-type dopant, aluminum or boron for example, although a carbon/aluminum sequential co-implantation employing approximately equal ion concentrations of carbon and aluminum is preferred. In a preferred implantation method, n-type nitrogen implantation is performed at a temperature greater than 600 degrees Celsius, and carbon/aluminum co-implantation is performed at room temperature. Photolithographic processes may be used to define the boundaries of the implanted regions. Post implantation annealing for all implanted regions, 62, 66 and 68 is performed at a common temperature approximately 1200–1600 degrees Celsius for 10–60 minutes, although individual annealing of each implanted region may also be practiced.

On-gate contact 20 and top ohmic contact 12 are created after post implantation annealing by depositing an n-type ohmic contact refractory metal, alloy or high temperature silicide onto top surface 11 over n-type subregion 66 and tub region 62. Similarly, top ohmic contact 12 is created by depositing a p-type ohmic contact refractory metal, alloy or high temperature silicide onto device top surface 11 over p-type subregion 68. Preferred materials for the ohmic contact on the p-type regions include titanium, whereas preferred ohmic contact materials for the n-type regions include nickel. The ohmic contacts are then annealed at a temperature of 800 to 1300 degrees Celsius, although a preferred annealing occurs at a temperature of 900–1100 degrees Celsius for a duration of up to 60 minutes. Although not shown in FIG. 2A, additional standard semiconductor manufacturing practices may be used, including the use of field oxide, passivation oxide, guard ring edge termination, field plates and p-n junction extensions.

Gate contacts 18 are created by one of a variety of methods depending on the type of gate structure desired. In the case of the Schottky gate contact 18 of FIG. 2A, gate metals that form high Schottky barrier heights, such as platinum, palladium and gold are preferred. A final gate metalization is used to deposit photolithographically defined gate contact 18. As further shown in FIG. 2B, a metal-semiconductor field effect transistor (MESFET) 69, having first subregion 66 of the top conductive region as the source and tub region 62 as the drain, results from the creation of a Schottky barrier gate over field effect region 80 of control layer 60.

Figure 2B:
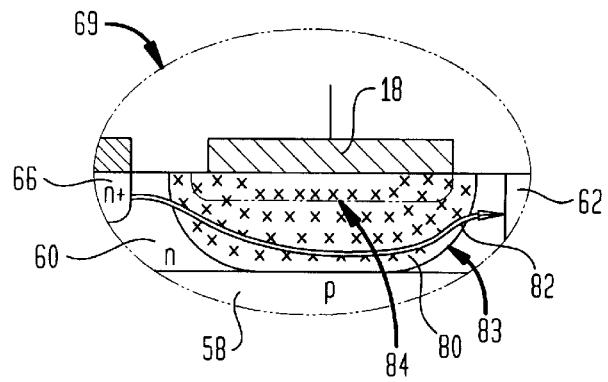
FIGS. 2B, 3B, 4B and 5B depict enlarged, more detailed views of portion of FIGS. 2A, 3A, 4A and 5A respectfully.

The field turn-off thyristor (FTO) of FIGS. 2A and 2B operates by applying external device voltage 14 between thyristor anode contact 12 and thyristor cathode contact 16 and applying a gate bias voltage between anode contact 12 and gate contact 18. The thyristor is considered forward-biased when the cathode is at a lower potential than the anode. Prior to thyristor turn-on, applied gate bias voltage 22 should cause field effect region 80 in control layer 60 of MESFET 69 to be devoid of carriers down to depletion boundary 83 which touches control p-n junction 61 (hereafter referred to as "pinched off"). "Pinch off" of field effect region 80 creates a high impedance path between first subregion 66 of top conductive region 64 and tub region 62. The doping concentration and thickness of control layer 60 affect the gate bias voltage needed for "pinch-off". At a gate bias voltage 22 of 0V, for example, sufficiently thin and lightly doped control layer 60 will enable the more shallow built-in depletion boundary 84 to touch control junction 61 and "pinch off" field effect region 80. At larger applied device voltages, differences in the relative doping concentration and thickness of blocking layer 46 and conductive layer 52 cause most of applied device voltage 14 to be sustained across reverse-biased blocking junction 54. As with control layer 60, the doping concentrations and thicknesses of blocking layer 46 and conduction layer 52 should be controlled during device fabrication so as to accommodate the desired applied device voltages 14 to achieve proper thyristor operation.

An external biasing current source 23 is introduced at turn-on gate 20 to turn the thyristor on. Current injection through tub region 62 and into conduction layer 52 turns-on upper p-n junction 59, which leads to hole injection from anode contact 12 into conduction layer 52 and blocking layer 46. This increased hole concentration in blocking layer 46 attracts electrons from n+ substrate 42, which are injected into blocking layer 46. Injected electrons diffuse and drift through blocking layer 46 and eventually reach conduction layer 52. These injected electrons, in turn cause more holes to be injected from anode layer 58. This positive-feedback, regenerative process continues until a high concentration of both electrons and holes in conduction layer 52 and blocking layer 46 causes the device voltage across blocking junction 54 to collapse, thereby turning the thyristor on. Note that the conductivity of p anode layer 58 is sufficiently lower than the conductivity of conductive layer 52. Thus, current applied through the tub region 62 in contact with conductive layer 52 passes from the tub region into the conductive layer, rather than into the anode layer.

After the thyristor has become conducting, it can be turned-off by applying an external gate turn-off voltage 22 at gate contact 18. MESFET 69 operates under gate turn-off voltage 22 to reduce the depletion region boundary 83 in field effect region 80 of control channel 60, thereby creating a low impedance conduction channel 82 coupling first subregion 66 of top conductive region 64 and tub region 62. At a threshold gate turn-off voltage, sufficient device current is shunted from anode contact 12 through conduction channel 82, conductive tub region 62 and into conduction layer 52, thereby bypassing upper p-n junction 59 and turning thyristor 8 "off" by breaking the positive-feedback process of carrier regeneration within the thyristor.

Figure 3A:
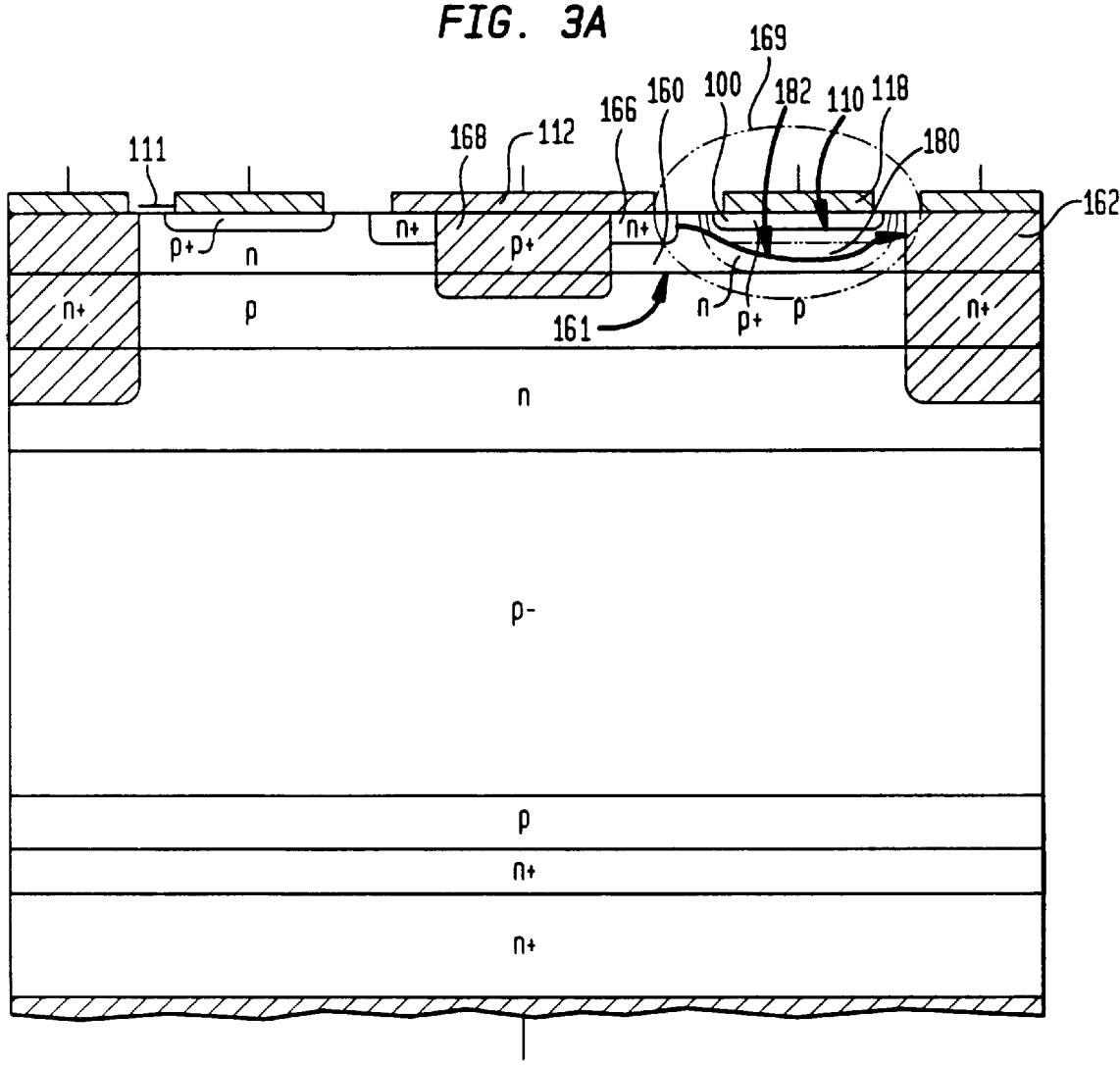
FIGS. 3A, 4A and 5A are enlarged sectional views of additional embodiments of the invention of FIG. 2A.
Figure 3B:
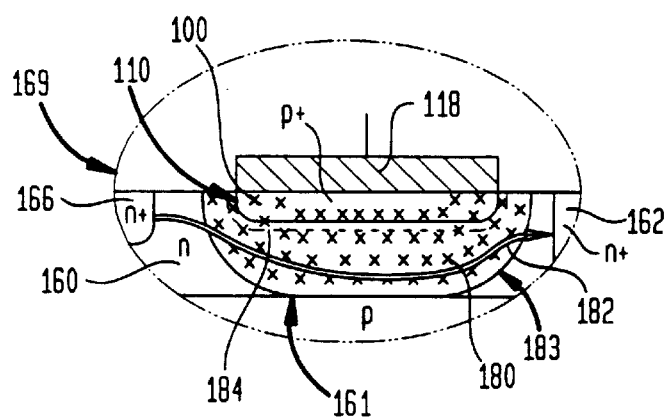
Figure 4A:
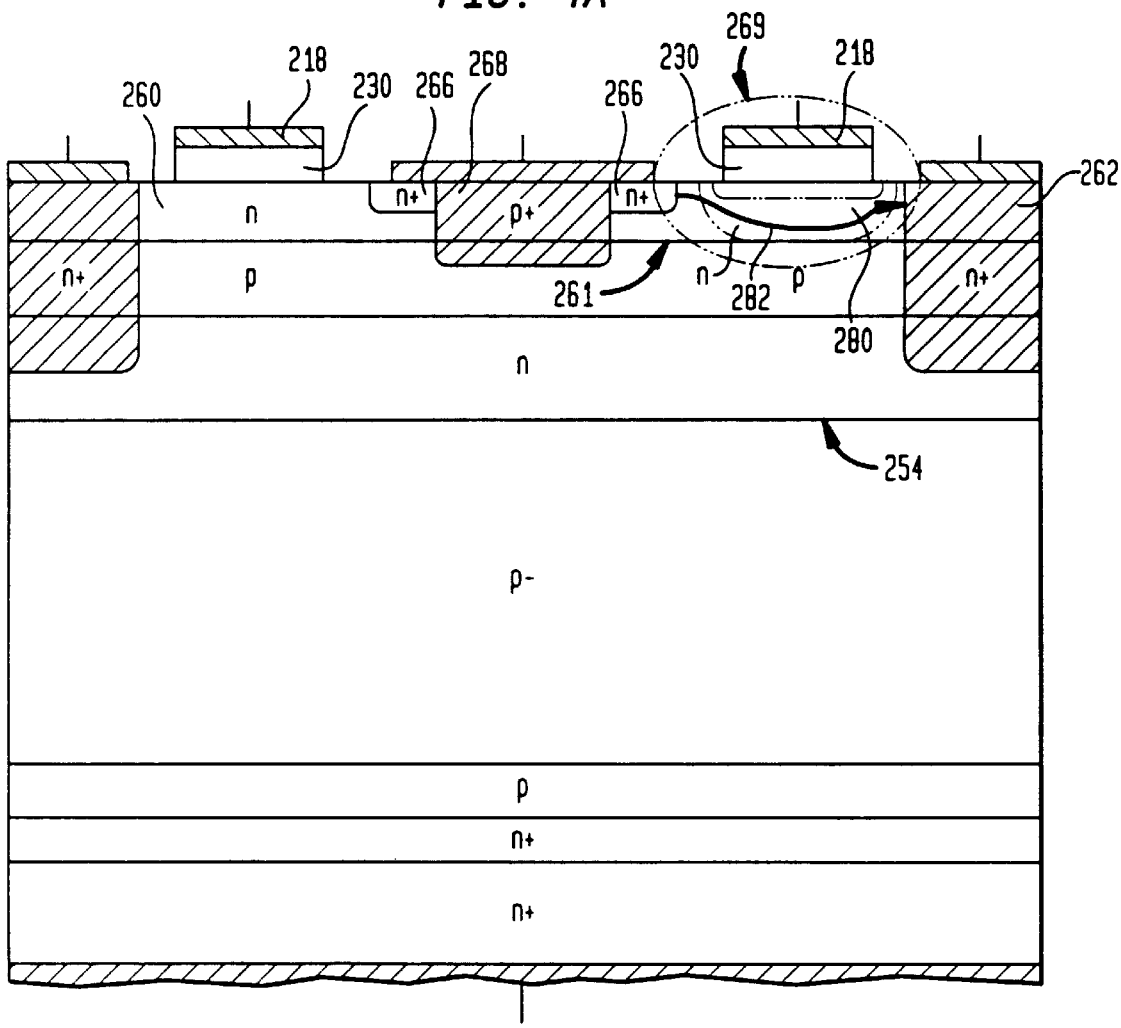

The thyristor devices of FIGS. 3A and 4A are fabricated and operated in a manner similar to the device of FIGS. 1 and 2, with the differences being in the fabrication and operation of the gate structure at gate contact 118. In the device of FIG. 3, a p+ ion implanted region 100 is created and extends into control layer 160 from top device surface 111 between first subregion 166 and tub region 162. P+ region 100 is implanted during a separate ion implantation process similar to that used to create the p+ subregion 168 of top conductive region. Alternatively, p+ region 100 and second subregion 168 can be created during a single ion implantation step by using a sacrificial mask layer on top of p+ region 100. P-type metal gate contact 118 overlies implanted region 100 and is created by depositing a p-type refractory metal, alloy or high temperature silicide onto device top surface 111. Metal gate contact 118 is desirably formed during the formation of anode contact 112 over p+ implanted subregion 168 and is annealed as discussed above.

In FIG. 3B, a junction field effect transistor (JFET) 169, having subregion 166 of top conductive region as a source and tub region 162 as a drain, results from the deposit of gate contact 118 over implanted region 100 within control layer 160. Prior to thyristor turn-on, an external applied gate voltage should cause field effect region 180 in control layer 160 of JFET 169 to be devoid of carriers down to depletion boundary 183 which touches control p-n junction 161 (i.e. "pinched-off"), effectively creating a high impedance path between first subregion 166 and tub region 162. The doping concentrations and thicknesses of control layer 160 and implant region 100 affect the gate bias voltage needed for "pinch-off". At a gate bias voltage of 0V, for example, sufficiently thin and lightly doped control layer 160 enables built-in depletion boundary 184 beneath junction 110 to "pinch-off" field effect region 180. During thyristor "turn-off", JFET 169 operates to reduce the depletion boundary 183 in field effect region 180 of control layer 160 as a result of an external gate turn-off voltage applied at gate contact 118, thereby creating a current shunting, low impedance conduction channel 182 coupling first conductive subregion 166 and tub region 162.

Figure 4B:
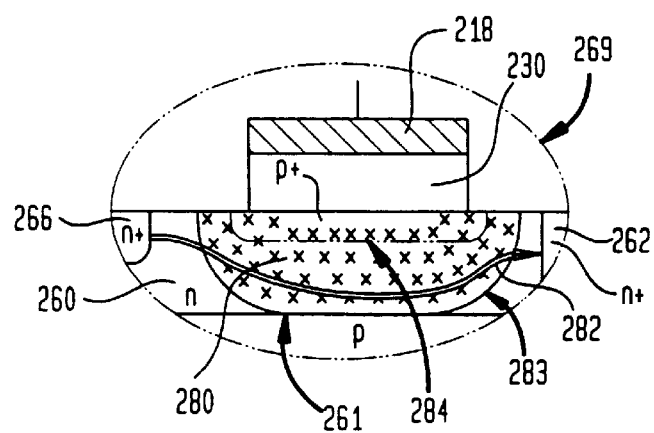

The alternative thyristor gate structures in FIGS. 4A and 4B are formed by growing and photolithographically defining gate insulator 230 over control layer 260 between first subregion 266 and tub region 262 following the post-implantation annealing of regions 266, 268, and 262. Although other insulators may be used, the preferred gate insulator is silicon dioxide and the preferred growth method is thermal oxidation performed at a temperature of 1100 to 1200 degrees Celsius. The duration of oxidation determines the final oxide thickness, preferably 400 to 2000 angstroms. For oxide insulators greater than 1000 angstroms, the preferred growth method is thermal growth of approximately 1000 angstroms of oxide followed by chemical vapor deposition of the remaining oxide. Gate contact 218 is deposited during either the p-type or n-type refractory metal deposition after the gate insulator has been defined. A preferred gate contact growth method is to deposit doped polysilicon on gate insulator 230 prior to depositing metal for gate contact 218. Annealing of all device contacts can be done as individual layers are deposited, although it is preferred that all contact annealing be done contemporaneously. All of the gate insulator 230 of FIGS. 4A and. 4B is formed over epitaxially deposited control layer 260 and is not subject to the large electric fields within the thyristor, which are sustained at blocking junction 254, thereby providing a high-quality, reliable gate insulator with high channel mobility free from excessive electric field stresses.

In the device of FIG. 4B, a depletion-mode metal-oxide-semiconductor (depletion-mode MOSFET) 269, having first subregion 266 of top conductive region as a source and tub region 262 as a drain, results from gate contacts 218 and insulative layers 230 being deposited over control layer 260. Prior to thyristor turn-on, an external applied gate bias voltage should cause field effect region 280 in control layer 260 of MOSFET 269 to be devoid of carriers down to depletion boundary 283 which touches control junction 261 (i.e. "pinched-off"), thereby creating a high impedance path between first subregion 266 and tub region 262. The doping concentration of control layer 260, the thicknesses of control layer 260 and oxide layer 230, as well as the workfunction of gate metal 118 affect the-gate bias voltage needed for "pinch-off". At a gate bias voltage of 0V, for example, sufficiently thin and lightly doped control layer 260 enables built-in depletion boundary 284 to "pinch-off" field effect region 280. In this case, the gate structure may actually be considered an enhancement-mode MOSFET. During thyristor "turn-off", MOSFET 269 operates to reduce the depletion boundary 283, in field effect region 280 of control layer 260 as a result of an external gate turn-off voltage applied at gate contact 218, thereby creating a current shunting, low impedance conduction channel 282 coupling first subregion 266 and tub region 262.

Figure 5A:
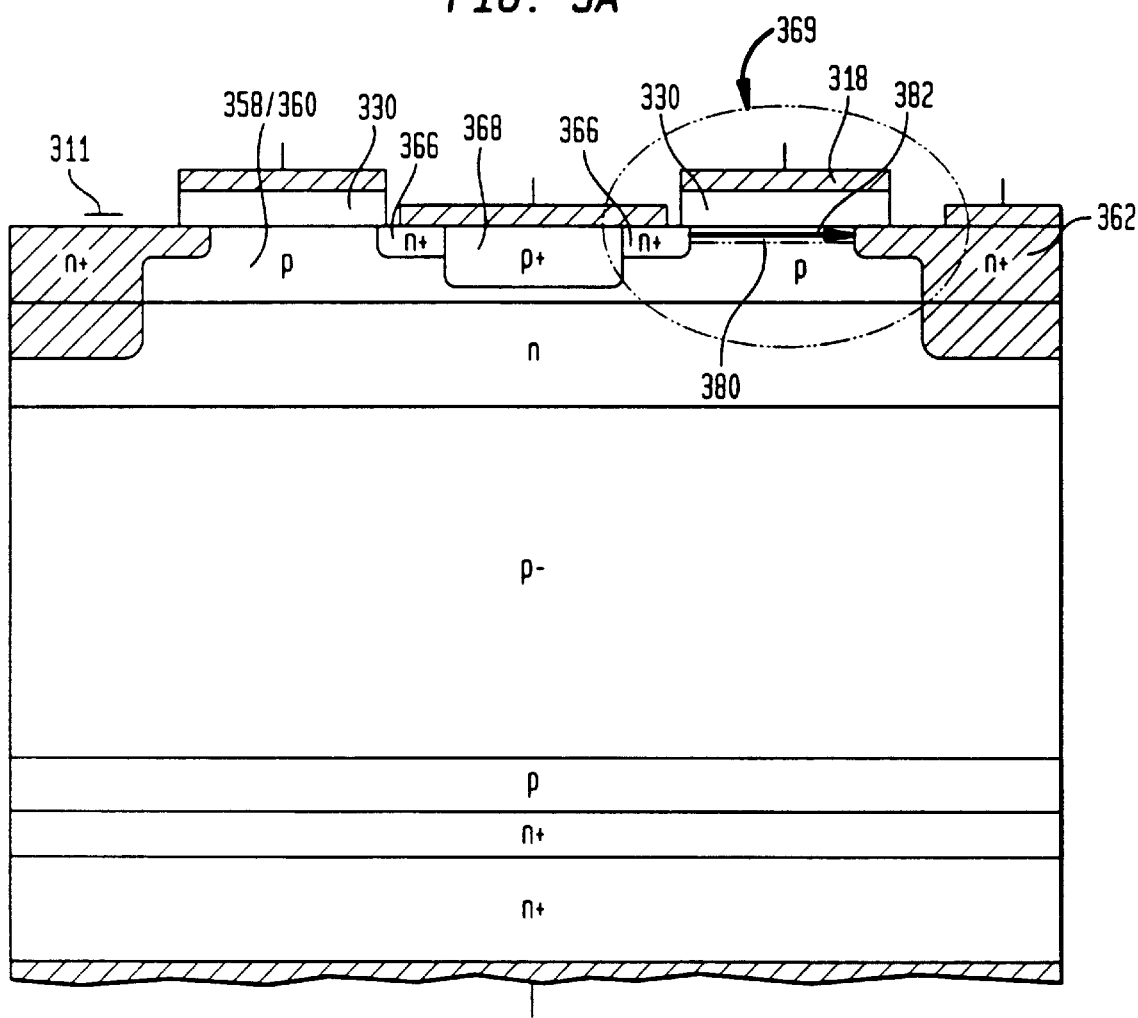
Figure 5B:
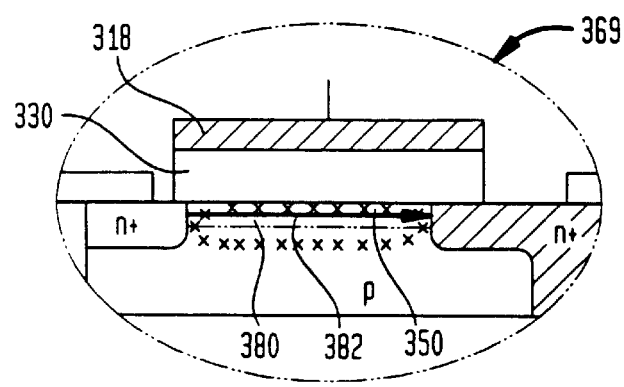

The device of FIGS. 5A and 5B omits the topmost n-type semiconductor layer used in FIG. 4A. Thus, the p-type anode layer 358 also functions as control layer 360 and defines the thyristor top surface 311. An enhancement-mode metal-oxide-semiconductor (enhancement-mode MOSFET) 369, having first subregion 366 as a source and tub region 362 as a drain, results from gate contacts 318 and insulative layers 330 being deposited over control layer 360 and partially over first subregion 366 and tub region 362. Prior to thyristor turn-on, the absence of an external applied gate voltage prohibits the creation of an enhanced carrier region 350 between subregion 366 and tub region 362, thereby maintaining a high impedance path between first subregion 366 and tub region 362. During thyristor "turn-off", MOSFET 369 operates under an external applied gate voltage to create conductive inversion channel 350 beneath insulative layer 330 and within field effect region 380 of control layer 360, thereby creating a current shunting, low impedance conduction channel 382 coupling first subregion 366 and tub region 362. A "normally-on" gate structure may also be operated with the structure of FIG. 5B by using an appropriate doping concentration for layer 360, thickness of insulative layer 330 and workfunction for the gate metal contact 318 such that the threshold gate voltage of MOSFET 369 becomes negative, essentially resulting in a depletion-mode device.

Referring now to FIGS. 6–9, high-power, field-controlled transistors (FCTs) are disclosed having similar fabrication steps and identical gate variations as the FTOs of FIGS. 2–5. Fabrication of FCT semiconductor layers is accomplished in the same manner as for corresponding layers of the FTOs, with the following differences. First, since only one device p-n junction is needed, an n- blocking layer 446 of FIG. 6A is epitaxially grown on buffer layer 444 without an overlying separate epitaxial conduction layer. Second, no optional intermediate layer is present since buffer layer 444 and substrate 442 are of the same conductivity type as the n-blocking layer 446. Third, no on-gate contact is needed since the gate structure performs both the FCT turn-on and turn-off functions.

Figure 6A:
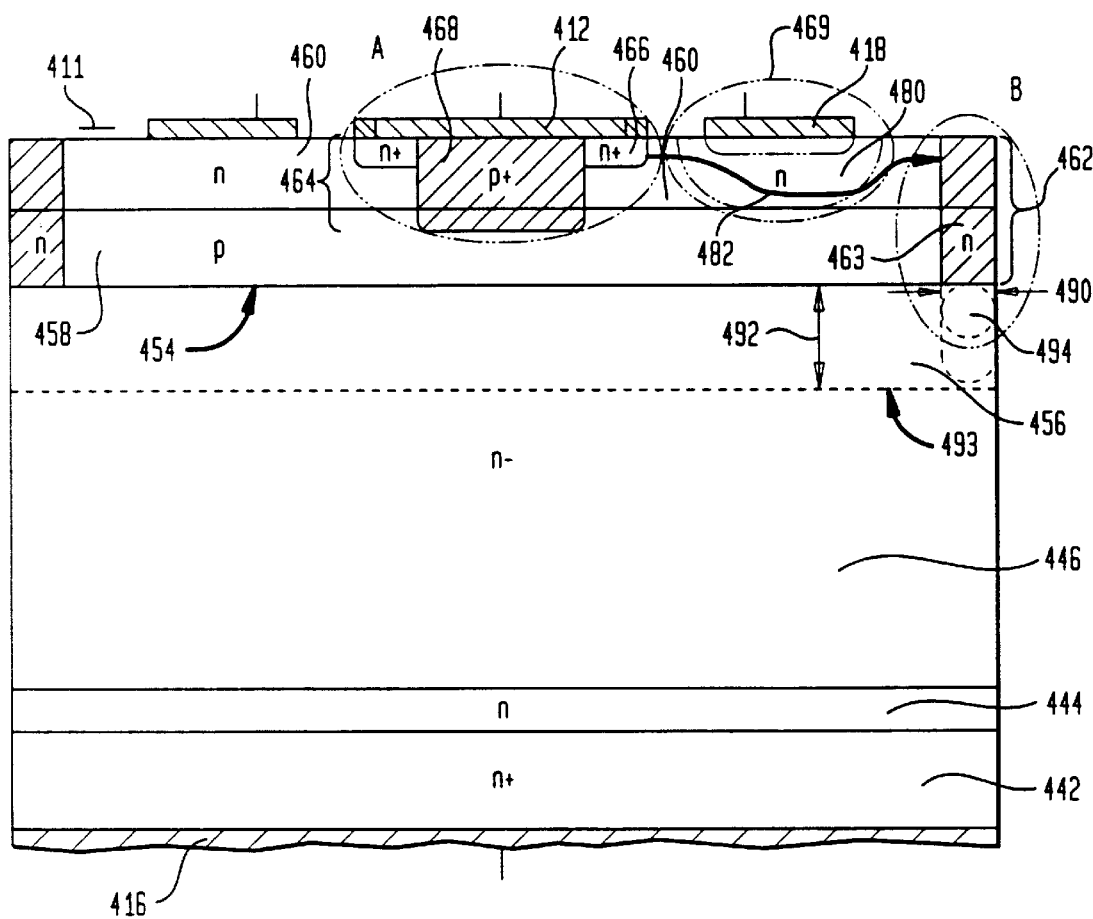
FIGS. 6A, 7, 8 and 9 are enlarged sectional views of field-controlled transistors according to further embodiments of the invention.

One additional FCT design consideration, not present in the FTOs, is depicted in FIG. 6A. In particular, rectangular tub region 462 should extend from device surface 411 at least to blocking junction 454, and optionally only slightly beyond. Further, at low external applied device voltages, high impedance, field effect region 480 sustains the device voltage. To ensure that blocking junction 454 sustains the device voltage as the device voltage increases, tub region 462 should have a width 490 less than one-half the depletion depth 492 of depletion region 456 in n-thick blocking layer 446. This limitation should be satisfied at all applied device voltages up to and including the maximum voltage that can be sustained by field effect region 480 between subregion 468 and tub region 462. This ensures that the depletion edges 493 of adjacent device cells reach each other in volume 494, beneath the tub region 462, thereby effectively shielding tub region 462 and field effect region 480 from further increases in external applied voltage and ensuring that any increased device voltage is dropped across blocking junction 454. Tub width 490 should typically be less than or about one micrometer (1 $\mu$m). An alternative embodiment of tub region 462, further achieving the shielding benefits described above, includes a triangular etched tub 462' in FIG. 6B. Triangular tub 462' is preferably dry etched using $SiO_2$ or other insulator as an etching mask to remove a triangular portion of control layer 460 and p source layer 458. Ion implantation, preferably using nitrogen, is then performed, forming a shallow n-type region 463.

Field-controlled transistor of FIG. 6A is operated by applying an external device voltage between top ohmic contact (transistor source) 412 and bottom ohmic contact (transistor drain) 416 and an external gate bias voltage at gate contact 418. Prior to FCT turn-on, applied gate bias voltage should cause field effect region 480 in control layer 460 of MESFET 469 to be "pinched off" as previously described. The external device voltage should be of sufficient magnitude to operate the transistor without exceeding the transistor breakdown voltage so as to cause device conduction without a gate bias voltage on gate contact 418. As with the FTOs of FIGS. 2–5, most of the applied device voltage is sustained across reverse-biased blocking junction 454 once the depletion region 456 in volume 494 beneath tub 462 is large enough to shield tub region 462 and field effect region 480 as described above. As with control layer 460, the doping concentrations and thicknesses of blocking layer 446 and source layer 458 affect the maximum sustainable applied device voltage and should be fabricated to achieve proper transistor operation.

To turn on the FCT of FIG. 6A, an appropriate gate-on potential is applied to MESFET 469 at gate contact 418 creating a conduction channel 482 electrically connecting first subregion 466 and tub region 462 as previously described. Electrons from subregion 468 flow along conduction channel 482 and through the low resistance tub region 462 across blocking junction 454 under the applied device voltage. At a threshold applied gate voltage, sufficient conduction occurs across blocking junction 454 in volume 494 beneath tub region 462 so as to cause a reduction in depletion width 492 beneath tub region 462, thereby turning the transistor on. In the "on" state, low resistance, full current conduction is enabled between FCT drain 416 and source 412 via tub 462. The low impedance path, from source contact 412 through conduction channel 482, tub region 462 and into blocking layer 446, should be designed to permit a sufficient current to be passed across blocking junction 454 so as to cause a reduction in depletion region 492 beneath tub region 462, thereby turning the transistor "on". The FCT can be turned off by applying an appropriate external gate voltage at gate contact 418 of MESFET 469 to cause field effect region 480 to be completely "pinched-off" as described above. Removal of conduction channel 482 stops conduction across blocking p-n junction 454, thereby ceasing current flow through the FCT.

The operative mechanisms employed by the different gate structures 469, 479 489 and 499 of FIGS. 6–9 are identical to those of the FTO devices of FIGS. 2–5 given the above overall device operation for the FCT. Gate structure 469 of FIG. 6A comprises a Schottky gate (MESFET). Gate structure 479 of FIG. 7 comprises a p-n junction gate (JFET). Gate structures 489 and 499 of FIGS. 7 and 8 comprise depletion-mode and enhancement-mode NMOS gates (DMOSFET and EMOSFET). The alternative embodiment of FIG. 6B may also be used for the tub regions of FIGS. 7–9.

Figure 6B:
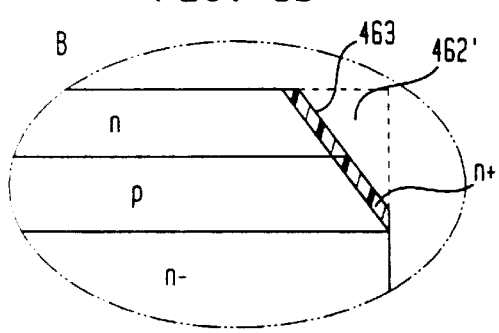
FIGS. 6B and 6C depict enlarged, more detailed views of alternative embodiment of portions of FIG. 6A, 7, 8, 10, 11 and 12 according to the present invention.
Figure 6C:
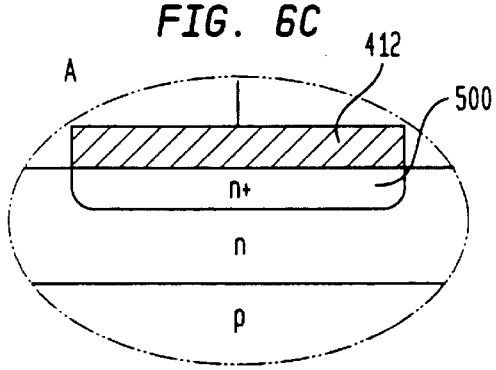
Figure 7:
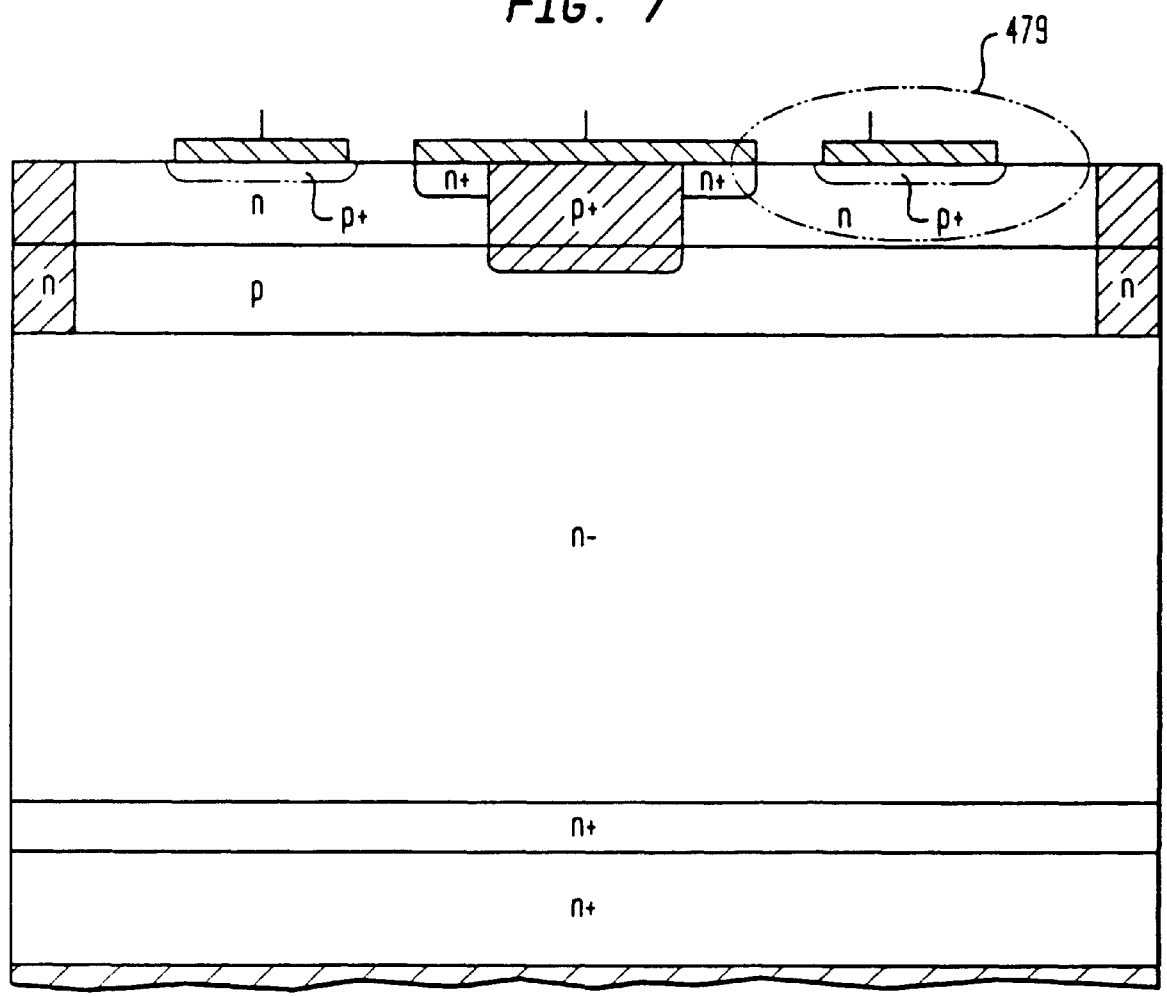
Figure 8:
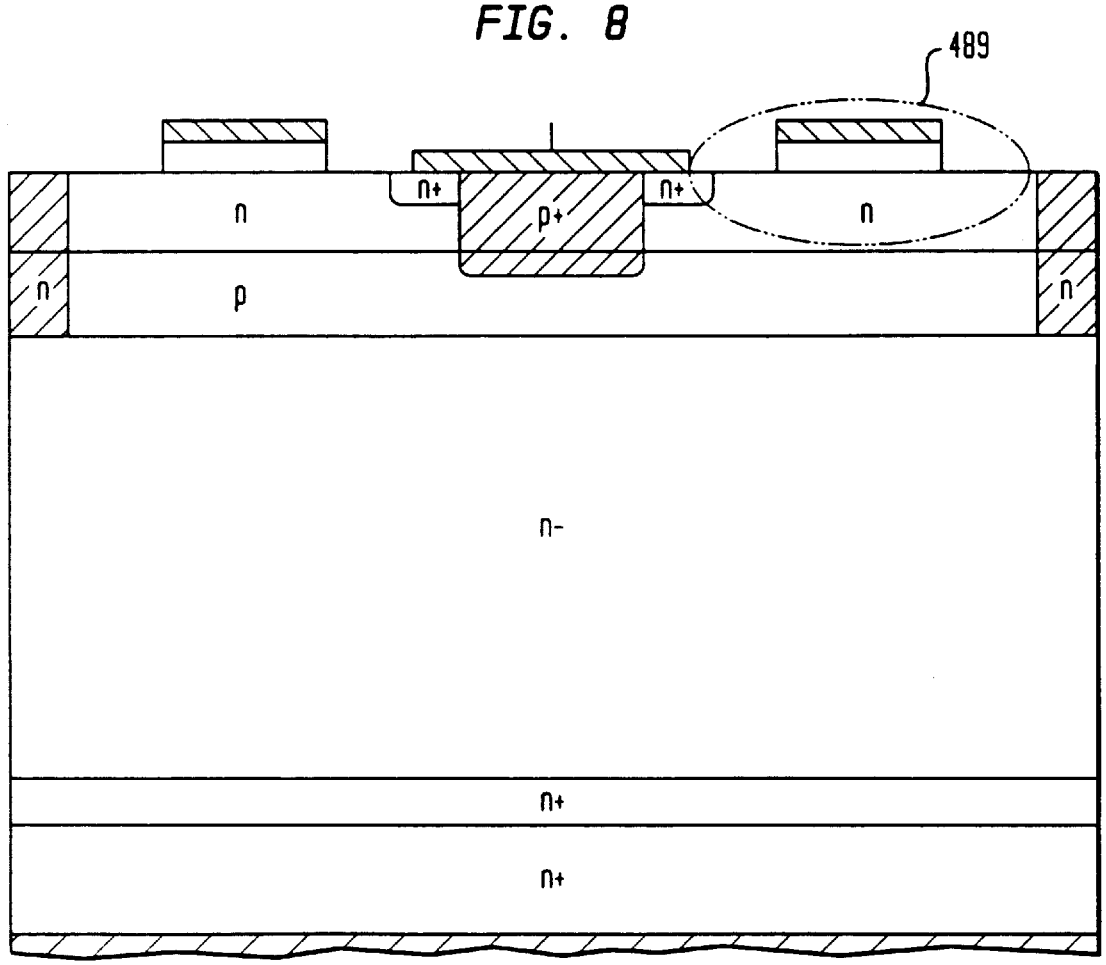
Figure 9:
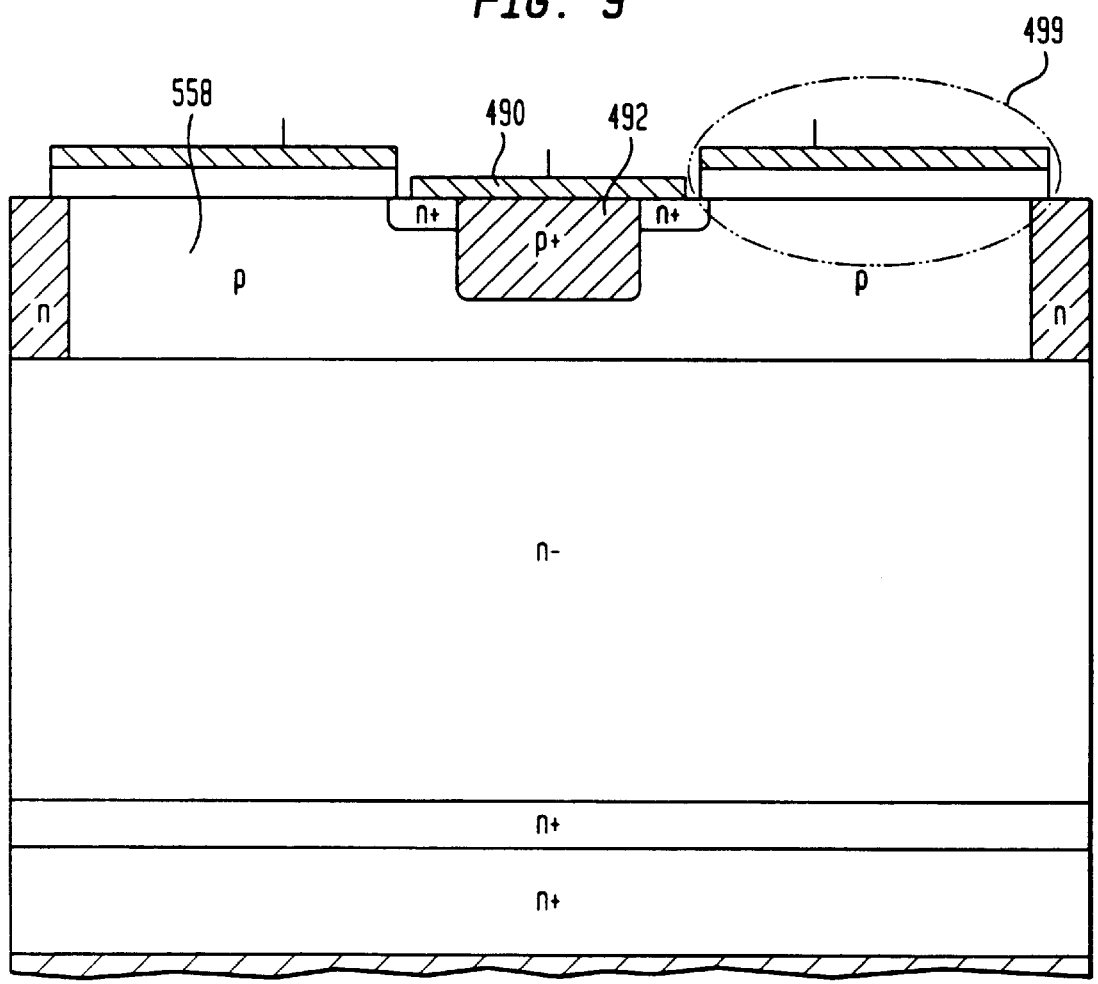

FIG. 6C represents an alternative embodiment of top conductive region 464 beneath top ohmic contact 412 in FIG. 6A. An n+ implantation is used to create top conductive region 500 without a p+ subregion. Full electrical contact of top ohmic contact 412 with the ion implanted n+ region 500 forms the source of the adjacent FCTs. The alternative embodiment of FIG. 6C can be properly employed in the devices of FIGS. 6A, 7 and 8. The alternative embodiment of FIG. 6C should not be used with the semiconductor device of FIG. 9, since p+ subregion 492 must be present to electrically connect top ohmic contact 490 to control layer 558 and eliminate any MOSFET body bias effect due to the floating voltage of control layer 558.

Referring now to FIGS. 10–13, high-power, field-gated bipolar transistors (FGBTs) are disclosed having similar fabrication steps and identical gate variations as the FCTs of FIGS. 6–9. In general, the FGBT of FIG. 10 consists of two p-n junctions, lower p-n junction 648 and blocking p-n junction 654, with device turn-on and turn-off effected through a single gate contact 618. Fabrication of FGBT semiconductor layers is accomplished in the same manner as for corresponding layers of the FCTs, with the following difference. Device fabrication begins with a p+ substrate 642 followed by epitaxial growth of p+ buffer layer 644. Optional intermediate layer 650 is included if an asymmetrical device is desired. In all other relevant respects, the fabrication of the FGBTs of FIGS. 10–13 are identical to the corresponding FCTs of FIGS. 6–9. Further, the operation of the FGBTs of FIGS. 10–13 is similar to that of the FCTs of FIGS. 6–9.

Figure 10:
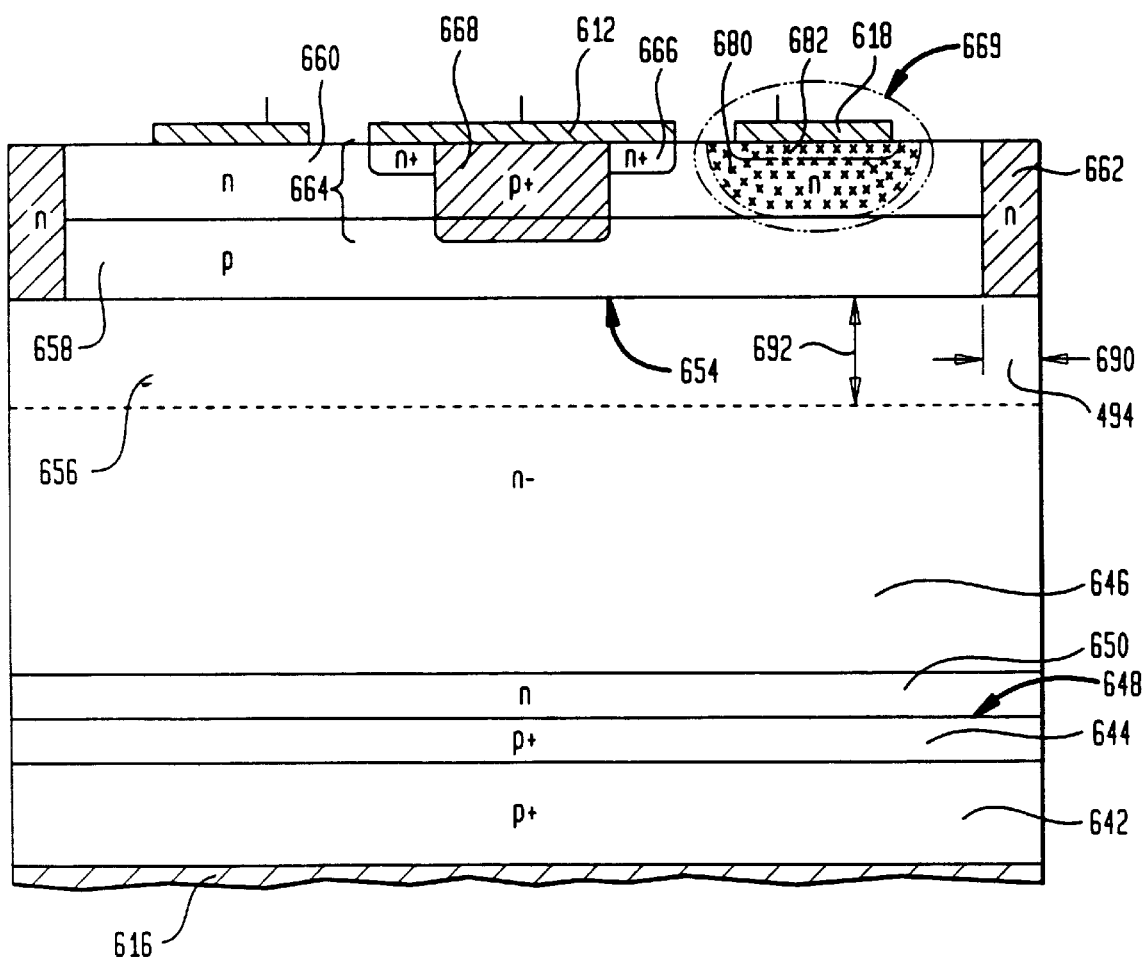
FIGS. 10–13 are enlarged sectional views of field-gated bipolar transistor cells according to further embodiments of the invention.
Figure 11:
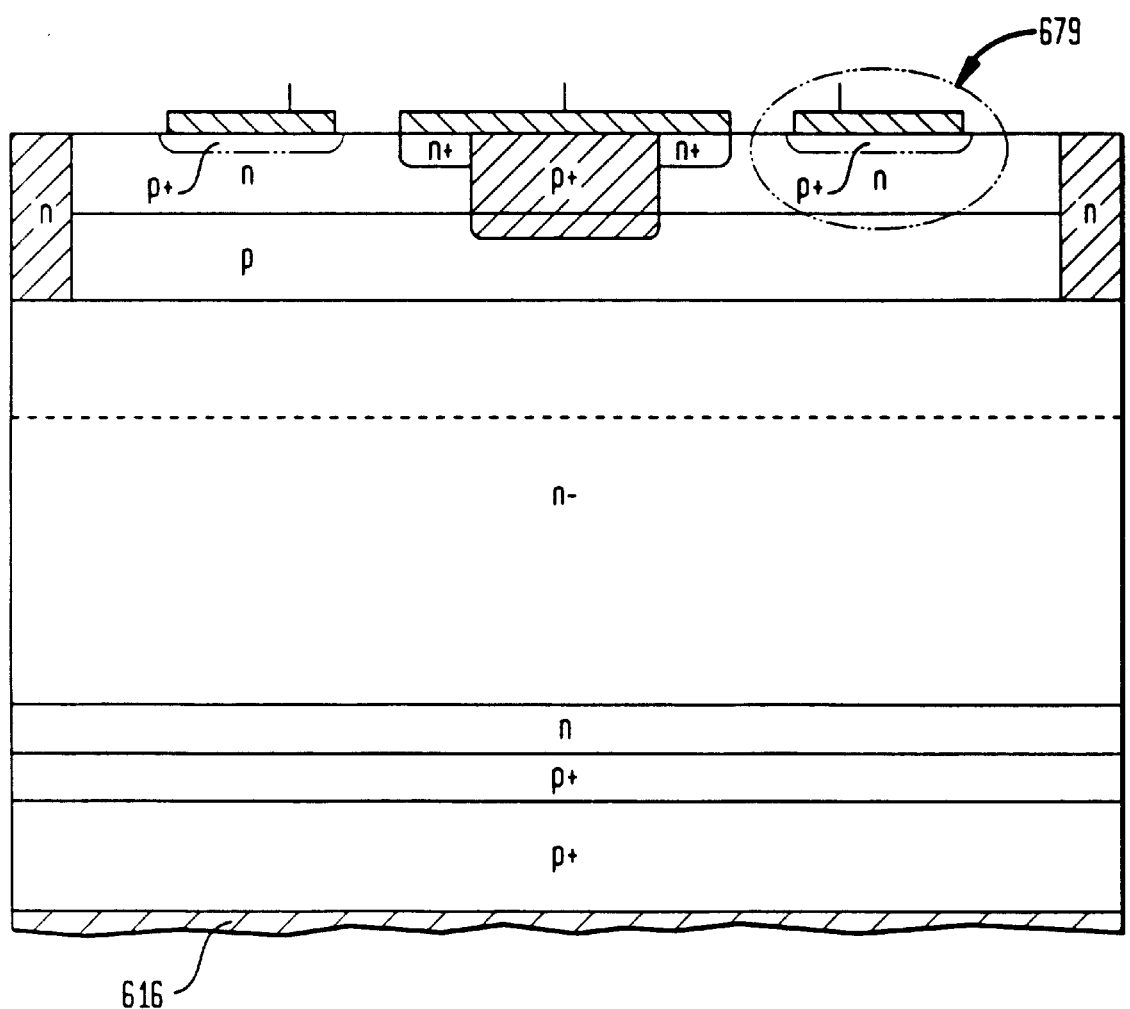
Figure 12:
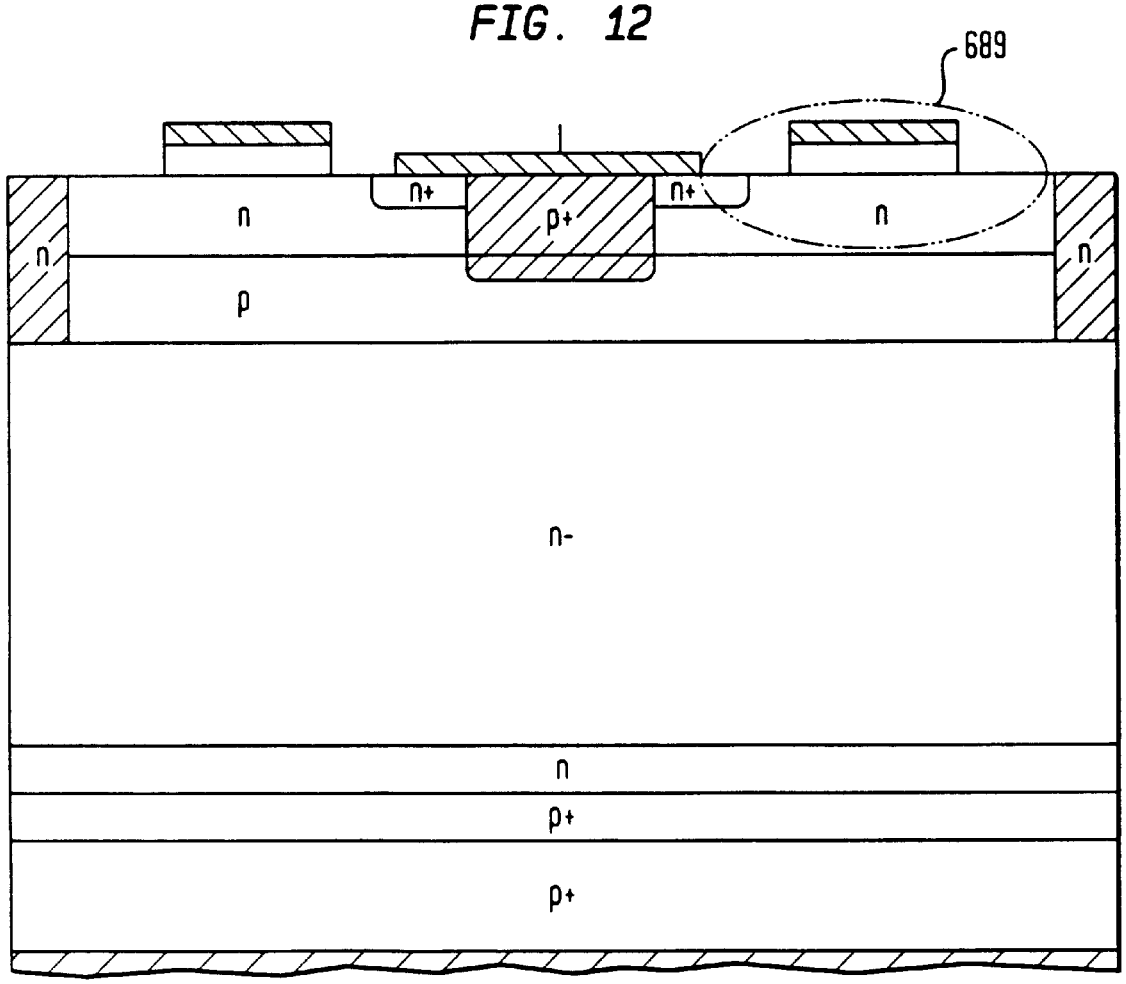
Figure 13:
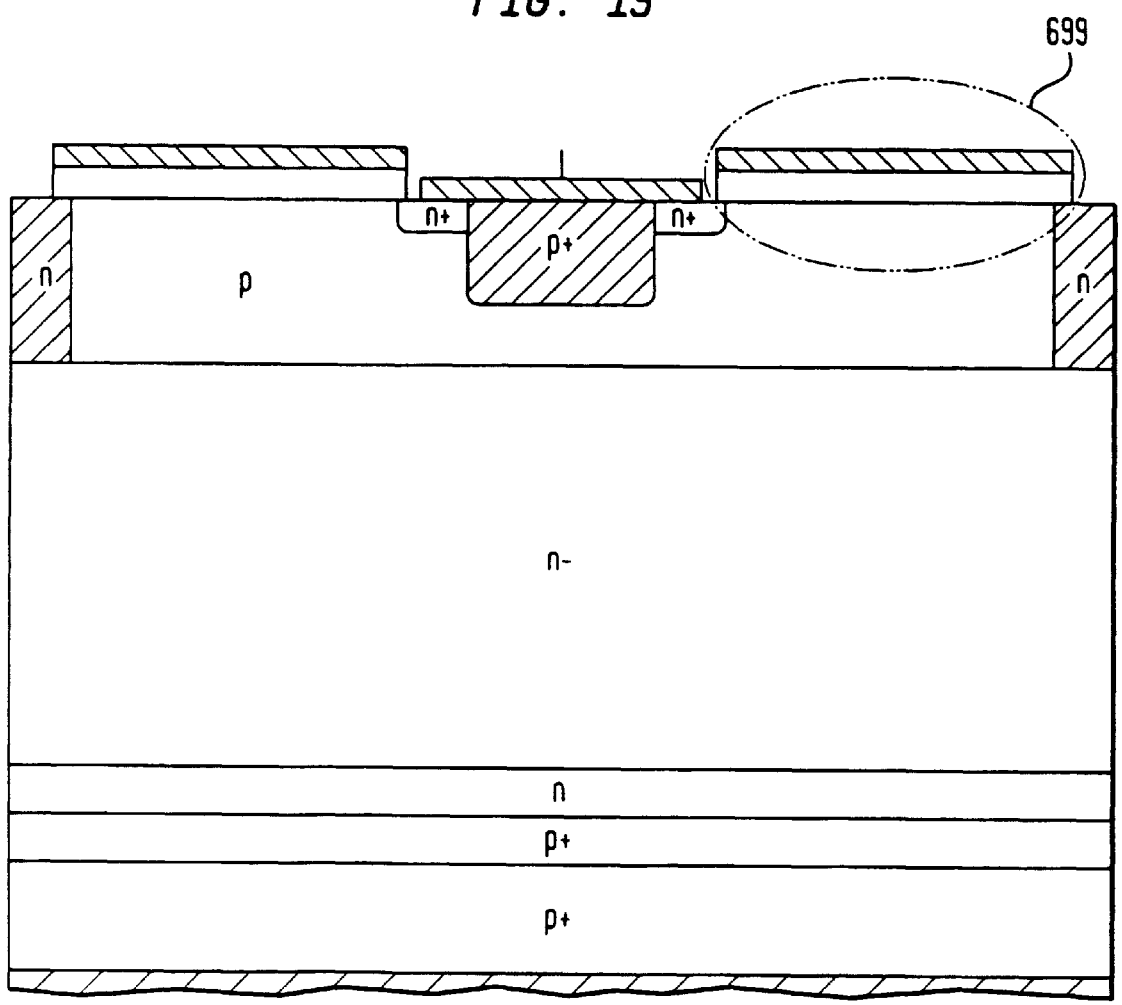

FIG. 6B represents an alternative embodiment of the tub regions of FIGS. 10–13, and FIG. 6C represents an alternative embodiment of the top conductive region of FIGS. 10, 11 and 12 for the same reasons described above.

While the particular embodiments of the invention have been shown and described, it will be obvious to those skilled in the art that the specific terms and figures are employed in a generic and descriptive sense only and not for the purposes of limiting or reducing the scope of the broader inventive aspects herein. The monolithic power semiconductor structures and methods of operation of the present invention are applicable to a broad range of semiconductor devices which can be fabricated from a variety of semiconductor materials. By disclosing the preferred embodiments of the present invention above, it is not intended to limit or reduce the scope of coverage for the general applicability of the present invention to specific devices or semiconductor materials. Moreover, the disclosed embodiments employ sample semiconductor conductivity types for each layer (i.e. p-type or n-type) along with corresponding, appropriate device and gate biasing voltages. Persons of skill in the art will easily recognize the substitution of n-type for p-type and vice-versa along with appropriate corresponding changes in device and biasing voltage polarities to correctly operate the devices. Furthermore, while a single vertical power device per wafer is disclosed, other structures yielding multiple devices per wafer, such as a horizontal devices, may also be constructed and according to the teachings of the present invention.

What is claimed is:

1. A semiconductor device comprising:
(a) a semiconductor structure having top and bottom surfaces, said structure including a plurality of semiconductor layers defining at least one p-n junction including a blocking p-n junction, all of said p-n junctions defined by said layers being remote from both said surfaces, said structure including a control layer defining the top surface of the structure; a top conductive region extending from said top surface; a conductive tub region spaced apart from said top conductive region and extending from said top surface toward said blocking p-n junction at least through said control layer, said control layer including a field effect region disposed between said top conductive region and said conductive tub region;
(b) a top ohmic contact in contact with said top surface at said top conductive region;
(c) a gate contact overlying said field effect region, whereby conductivity of said field effect region can be selectively controlled by a controlling potential on said gate contact to create and interrupt a conductive channel within said control layer, said top conductive region and said conductive tub region being coupled and decoupled by said conductive channel, said conductive tub region extending downwardly to one of said p-n junctions defined by said layers so that conductivity of said one of said p-n junctions may be varied by varying current flow through said conductive tub region via said field effect region; and (d) a bottom ohmic contact in contact with said semiconductor structure below said blocking p-n junction, said semiconductor layers being arranged so that when a potential is sustained between said top and bottom ohmic contacts, a major portion of said potential appears across said blocking p-n junction thereby forming depletion regions about said blocking p-n junction.

2. The semiconductor device of claim 1 further comprising a control p-junction disposed above said blocking p-n junction and remote from said op surface, said gate contact including a Schottky contact such that said gate contact, said field effect region, said top conductive region and said conductive tub region constitute a MESFET, whereby said selective controlling potential on said gate contact selectively creates or interrupts a conductive channel coupling said top conductive region with said conductive tub region within said control layer.

3. The semiconductor device of claim 1 further comprising a control p-n junction disposed above said blocking p-n junction and remote from said top surface, said field effect region having a gate conductive region extending from said top surface under said gate contact toward said control p-n junction such that said gate contact, said field effect region, said top conductive region and said conductive tub region constitute a JFET, whereby said selective controlling potential on said gate contact selectively creates or interrupts a conductive channel coupling said top conductive region with said conductive tub region within said control layer.

4. The semiconductor device of claim 1 further comprising a control p-n junction disposed above said blocking p-n junction and remote from said top surface, said gate contact including an insulative layer on said top surface and a conductive contact on said insulative layer such that said gate contact, said field effect region, said top conductive region and said conductive tub region constitute a MOSFET, whereby said selective controlling potential on said gate contact selectively creates or interrupts a conductive channel coupling said top conductive region with said conductive tub region within said control layer.

5. The semiconductor device of claim 1 in which said top conductive region includes a first subregion of same semiconductor type as said control layer and extending to a first depth from said top surface, a second subregion of opposite semiconductor type from said control layer extending to a second depth from said top surface and disposed between said first subregion and said field effect region, both of said subregions being in contact with said top ohmic contact, said gate contact including an insulative layer on said top surface and a conductive contact on said insulative layer such that said gate contact, said field effect region, said second subregion of said top conductive region and said conductive tub region constitute a MOSFET, whereby said selective controlling potential on said gate contact selectively creates or interrupts a conductive channel coupling said top conductive region with said conductive tub region within said control layer.

6. The semiconductor device of claim 4 or claim 5 in which said field effect region includes unimplanted epitaxially grown semiconductor defining said top surface in said field effect region, whereby said insulative layer includes an insulating compound on said unimplanted epitaxially grown semiconductor.

7. The semiconductor device of claim 1 in which said semiconductor device is a field controlled transistor, said conductive tub region extending at least to said blocking p-n junction and having a bottom end being disposed in said depletion region of said blocking p-n junction when said potential is sustained between said top and bottom ohmic contacts, said conductive tub region providing a lowest resistance current path from said top ohmic contact, through said conductive channel to said blocking p-n junction, said blocking p-n junction turning on and off in response to said selective controlling potential on said gate contact, whereby said transistor switches "on" and "off".

8. The semiconductor device of claim 7 in which said top conductive region includes a first subregion of same semiconductor type as said control layer and extending to a first depth from said top surface; a second subregion of opposite semiconductor type from said control layer extending to a second depth from said top surface and disposed between said first subregion and said field effect region, both subregions in contact with said top ohmic contact, said gate contact including an insulative layer on said top surface and a conductive contact on said insulative layer such that said gate contact, said field effect region, said second subregion of said top conductive region and said conductive tub region constitute a MOSFET.

9. The semiconductor device of claim 7 further comprising a control p-n junction disposed above said blocking p-n junction and remote from said top surface.

10. The semiconductor device of claim 9 in which said gate contact further comprises a Schottky contact such that said gate contact, said field effect region, said top conductive region and said conductive tub region constitute a MESFET.

11. The semiconductor device of claim 9 in which said field effect region further comprises a gate conductive region extending from said top surface under said gate contact toward said control p-n junction such that said gate contact, said field effect region, said top conductive region and said conductive tub region constitute a JFET.

12. The semiconductor device of claim 9 in which said gate contact includes an insulative layer on said top surface and a conductive contact on said insulative layer such that said gate contact, said field effect region, said top conductive region and said conductive tub region constitute a MOSFET.

13. The semiconductor device of claim 1 in which said semiconductor device is a field-gated bipolar transistor, said semiconductor structure having a lower p-n junction remote from said top and bottom surfaces and disposed below said blocking p-n junction, said conductive tub region extending at least to said blocking p-n junction and having a bottom end being disposed in said depletion region of said blocking p-n junction when said potential is sustained between said top and bottom ohmic contacts, said conductive tub region providing a lowest resistance current path from said top ohmic contact, through said conductive channel to said blocking p-n junction, said blocking p-n junction turning on and off in response to said selective controlling potential on said gate contact, whereby said bipolar transistor switches "on" and "off".

14. The semiconductor device of claim 13 in which said top conductive region includes a first subregion of same semiconductor type as said control layer and extending to a first depth from said top surface, a second subregion of opposite semiconductor type from said control layer extending to a second depth from said top surface and disposed between said first subregion and said field effect region, both subregions in contact with said top ohmic contact, said gate contact including an insulative layer on said top surface and a conductive contact on said insulative layer such that said gate contact, said field effect region, said second subregion of said top conductive region and said conductive tub region constitutes a MOSFET.

15. The semiconductor device of claim 13 further comprising a control p-n junction disposed above said blocking p-n junction and remote from said top surface.

16. Th e semiconductor device of claim 15 in which said gate contact further comprises a Schottky contact such that said gate contact, said field effect region, said top conductive region and said conductive tub region constitute a MESFET.

17. The semiconductor device of claim 15 in which said field effect region further comprises a gate conductive region extending from said top surface under said gate contact toward said control p-n junction such that said gate contact, said field effect region, said top conductive region and said conductive tub region constitute a JFET.

18. The semiconductor device of claim 15 in which said gate contact includes an insulative layer on said top surface and a conductive contact on said insulative layer such that said gate contact, said field effect region, said top conductive region and said conductive tub region constitute a MOSFET.

19. The semiconductor device of claim 1 in which said semiconductor device is a field turn-off thyristor;
   (a) said top conductive region including a first subregion extending to a first depth from said top surface, and a second subregion extending to a second depth from said top surface and disposed between said first subregion and said field effect region, both subregions in contact with said top ohmic contact;
   (b) said semiconductor structure having a lower and an upper p-n junction, both remote from said top and bottom surfaces; said lower p-n junction disposed below said blocking p-n junction, said upper p-n junction disposed above said blocking p-n junction, said conductive tub region extending at least through said upper p-n junction; a latch-on gate ohmic contact overlying said conductive tub region at said top surface;
   (c) said conductive tub region providing a lowest resistance current path from said top ohmic contact, through said conductive channel to said upper p-n junction;
   (d) whereby when said conductive channel is interrupted, current flow through said conductive tub region can be selectively controlled by a controlling current applied through said latch-on gate ohmic contact to turn on said upper p-n junction and thereby switch "on" said thyristor; and whereby in absence of said controlling current on said latch-on gate contact, said controlling potential on said gate contact can create said conductive channel to turn off said upper p-n junction and thereby switch "off" said thyristor.

20. The semiconductor device of claim 19 in which said first subregion is of same semiconductor type as said control layer, said second subregion is of opposite semiconductor type from said control layer, said gate contact including an insulative layer on said top surface and a conductive contact on said insulative layer such that said gate contact, said field effect region, said second subregion of said top conductive region and said conductive tub region constitute a MOSFET.

21. The semiconductor device of claim 19 further comprising a control p-n junction disposed above said upper p-n junction and remote from said top surface, said first subregion being of opposite semiconductor type from said control layer, said second subregion of same semiconductor type as said control layer, said first depth of said first subregion extending beyond said control p-n junction from said top surface.

22. The semiconductor device of claim 21 in which said gate contact further comprises a Schottky contact such that said gate contact, said field effect region, said second subregion of said top conductive region and said conductive tub region constitute a MESFET.

23. The semiconductor device of claim 21 in which said field effect region further comprises a gate conductive region extending from said top surface under said gate contact toward said control p-n junction such that said gate contact, said field effect region, said second subregion of said top conductive region and said conductive tub region constitute a JFET.

24. The semiconductor device of claim 21 in which said gate contact includes an insulative layer on said top surface and a conductive contact on said insulative layer such that said gate contact, said field effect region, said second subregion of said top conductive region and said conductive tub region constitute a MOSFET.

25. The semiconductor device of claim 13 or claim 19 in which said semiconductor structure further comprises a blocking layer of relatively low doping concentration disposed below said blocking p-n junction and an enhancement layer of same semiconductor type and relatively higher doping concentration as said blocking layer disposed above said lower p-n junction.

26. The semiconductor device of any one of claims 2, 3, 4, 9, or 15 in which said top conductive region includes a first subregion of opposite semiconductor type from said control layer and extending through said control p-n junction from said top surface, and a second subregion of the same semiconductor type as said control layer extending to a second depth from said top surface and disposed between said first subregion and said field effect region, both of said subregions in contact with said top ohmic contact.

27. The semiconductor device of claim 9 or claim 15, in which said top conductive region is of same semiconductor type as said control layer, said top conductive region not extending beyond said control p-n junction from said top surface, said top conductive region being in contact with said top ohmic contact.

28. The semiconductor device of claim 1 in which said semiconductor layers are composed of a material selected from the group consisting of SiC, Si, Diamond, GaAs, GaN, AlN, AlGaN, InGaN, GaP, AlGaP or AlGaAsP and combinations thereof.

29. The semiconductor device of claim 1 in which said semiconductor layers include a bottom layer, said bottom layer being in contact with said bottom ohmic contact and further including a buffer layer for improving said semiconductor structure quality.

30. The semiconductor device of claim 1 in which said semiconductor device has no insulative layer as part of said gate contact.

31. The semiconductor device of claim 1 further comprising a control p-n junction disposed above said blocking p-n junction and remote from said top surface, said field effect region including an unimplanted portion of said control layer.

32. The semiconductor device of claim 1 further comprising a control p-n junction disposed above said blocking p-n junction and remote from said top surface; an upper p-n junction disposed between said blocking p-n junction and said control p-n junction.

33. The semiconductor device of claim 1 further comprising a lower p-n junction disposed below said blocking p-n junction and remote from said bottom surface.

34. The semiconductor device of claim 1 in which said top conductive region includes a first subregion of opposite semiconductor type from said control layer extending to a first depth at least through said control layer from said top surface; a second subregion of the same semiconductor type as said control layer extending to a second depth not through said control layer from said top surface and disposed between said first subregion and said field effect region, both subregions being in contact with said top ohmic contact.

35. The semiconductor device of claim 1 in which said top conductive region includes a first subregion of same semiconductor type as said control layer extending to a first depth not through said control layer from said top surface; a second subregion of opposite semiconductor type from said control layer and extends to a second depth, shallower than said first depth, from said top surface and disposed between said first subregion and said field effect region, both subregions being in contact with said top ohmic contact.

36. The semiconductor device of claim 1 in which said top conductive region is of the same semiconductor type as said control layer and not extending through said control layer from said top surface, said first conductive subregion being in contact with said top ohmic contact.

37. The semiconductor device of claim 1 in which said conductive tub region extends at least to said blocking p-n junction and has a bottom end disposed in said depletion region of said blocking p-n junction when said potential is sustained between said top and bottom ohmic contacts such that said field effect region is shielded from said potential.

38. The semiconductor device of claim 1 further comprising a latch-on gate ohmic contact overlying said conductive tub region at said top surface.

39. The semiconductor device of claim 1 further comprising a lower and an upper p-n junction, both remote from said top and bottom surfaces, said lower p-n junction disposed below said blocking p-n junction, said upper p-n junction disposed above said blocking p-n junction, said conductive tub region extending through said upper p-n junction; a latch-on gate ohmic contact overlaying said conductive tub region at said top surface, said semiconductor layers being of relative conductivity, whereby a latch-on current applied at said latch-on gate ohmic contact, flows through said conductive tub region and laterally beneath said upper p-n junction before traversing said upper p-n junction beneath said top ohmic contact.

40. The method of operating a forward-biased semiconductor device having a plurality of semiconductor layers, a top and bottom surface and including a control layer defining the top layer of the device, said plurality of semiconductor layers defining at least one p-n junction including a blocking p-n junction, all of said p-n junctions defined by said layers being remote from both of said surfaces, said method comprising the steps of:

(a) applying a voltage between a top and a bottom ohmic contact of said semiconductor device;

(b) sustaining said voltage across said blocking p-n junction;

(c) selectively creating or interrupting a conduction channel in said control layer between a top conductive region, disposed below said top ohmic contact, and a tub conductive region, spaced apart from said top conductive region and extending at least to one of said p-n junctions defined by said layers by applying a control potential to a gate contact disposed over said control layer so as to selectively turn on and turn off said blocking p-n junction and said semiconductor device.

41. The method of operating a forward-biased thyristor semiconductor device having a plurality of semiconductor layers, a top and bottom surface and including a control layer defining the top layer of the device, said plurality of semiconductor layers defining at least one p-n junction including a blocking p-n junction, all of said p-n junctions defined by said layers being remote from both of said surfaces, said method comprising the steps of:

(a) applying a voltage between a top and a bottom ohmic contact of said semiconductor device;

(b) sustaining said voltage across said blocking p-n junction;

(c) selectively applying a control current to a latch-on gate contact disposed over a tub conductive region, said tub conductive region extending through an upper p-n junction defined by said semiconductor layers, said upper p-n junction being disposed above said blocking p-n junction so as to selectively turn on said upper p-n junction and said thyristor semiconductor device;

(d) selectively creating or interrupting a conduction channel in said control layer between a top conductive region, disposed below said top ohmic contact, and a tub conductive region, spaced apart from said top conductive region and extending through said upper p-n junction, by applying a control potential to a gate contact disposed over said control layer so as to selectively turn off and turn on said upper p-n junction and said thyristor semiconductor device.

\* \* \* \* \*

UNITED STATES PATENT AND TRADEMARK OFFICE
CERTIFICATE OF CORRECTION

PATENT NO. : 6,107,649
DATED : August 22, 2000
INVENTOR(S) : Zhao

It is certified that error appears in the above-identified patent and that said Letters Patent is hereby corrected as shown below:

Col. 3, line 35, "turnoff" should read --turn-off--.

Col. 5, line 37, "defmed" should reas --defined--.

Col. 7, line 52, after "the" delete -- - --.

Col. 11, line 17, "p-junction" should read --p-n junction--.

Col. 11, line 18, "op" should read --top--.

Col. 13, line 11, "Th e" should read --The--.

Signed and Sealed this

Twenty-fourth Day of April, 2001

Attest:

NICHOLAS P. GODICI

*Attesting Officer*   *Acting Director of the United States Patent and Trademark Office*